(12) United States Patent
Ding (10) Patent No.: US 12,387,938 B2
(45) Date of Patent: Aug. 12, 2025

(54) SEMICONDUCTOR TEST STRUCTURE AND METHOD FOR MANUFACTURING SAME

(71) Applicant: CHANGXIN MEMORY TECHNOLOGIES, INC., Hefei (CN)

(72) Inventor: Rui Ding, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 624 days.

(21) Appl. No.: 17/849,004

(22) Filed: Jun. 24, 2022

(65) Prior Publication Data

US 2023/0290696 A1 Sep. 14, 2023

(30) Foreign Application Priority Data

Mar. 8, 2022 (CN) .......................... 202210227575.1

(51) Int. Cl.
```
H01L 21/31      (2006.01)
H01L 21/3065    (2006.01)
H01L 21/3213    (2006.01)
H01L 21/66      (2006.01)
```
(52) U.S. Cl.
CPC .......... H01L 21/31 (2013.01); H01L 21/3065 (2013.01); H01L 21/32134 (2013.01); H01L 22/30 (2013.01); H01L 22/32 (2013.01)

(58) Field of Classification Search
None
See application file for complete search history.

(56) References Cited

U.S. PATENT DOCUMENTS

| | | | |
|---|---|---|---|
| 6,455,406 B1 * | 9/2002 | Linderer | .......... H01L 21/76802 257/E21.309 |
| 11,145,720 B2 | 10/2021 | Lee et al. | |

FOREIGN PATENT DOCUMENTS

CN 110718590 A 1/2020

OTHER PUBLICATIONS https://www.cameca.com.cn/products/apt/technique, date retrieved Jun. 24, 2022.

* cited by examiner

*Primary Examiner* — Joshua L Allen
*Assistant Examiner* — Andrew Keelan Laobak
(74) *Attorney, Agent, or Firm* — Syncoda LLC; Feng Ma (57) ABSTRACT

A semiconductor test structure and a method for manufacturing the same are provided. The method for manufacturing a semiconductor test structure includes providing a semiconductor structure, which includes a doped layer and a metal layer located in the doped layer; forming at least one opening exposing the metal layer in the semiconductor structure; removing the metal layer by a reaction between a wet etching solution and the metal to form a hollow portion, in which the wet etching solution enters the semiconductor structure through the opening; and filling the hollow portion with a non-metallic material layer through the opening to form the semiconductor test structure, in which an evaporation pressure of the metal layer is greater than an evaporation pressure of the non-metallic material layer.

14 Claims, 10 Drawing Sheets

SEMICONDUCTOR TEST STRUCTURE AND METHOD FOR MANUFACTURING SAME

CROSS-REFERENCE TO RELATED APPLICATION

This application claims priority to Chinese Patent Application No. 202210227575.1, filed on Mar. 8, 2022 and entitled "Semiconductor Test Structure and Method for Manufacturing Same", the disclosure of which is incorporated by reference in its entirety.

BACKGROUND

During manufacturing of semiconductor devices, tungsten is used as word line material in a dynamic random access memory as it has characteristics of low resistivity, strong thermal stability and an excellent chemical resistance. When sample preparation is performed on semiconductor device array equipment, atom probe tomography is used to characterize the three-dimensional structure of the semiconductor devices. With the atom probe tomography, atoms of a solid material are separated by the action of an electric field, and then under the action of an accelerating field the ions are captured by a detector.

Since tungsten can only be evaporated under a very high electric field, it is difficult to achieve the effect by using the atom probe tomography for transistors containing tungsten, which hinders the application of the atom probe tomography in the manufacture of the dynamic random access memory.

Therefore, avoiding the influence of the tungsten or other materials in a buried structure on atom probe tomography is the technical problem that needs to be resolved.

SUMMARY

The disclosure relates to the field of semiconductor manufacture, and in particular, to a semiconductor test structure and a method for manufacturing the semiconductor test structure.

Embodiments of the disclosure provide a method for manufacturing a semiconductor test structure, including: providing a semiconductor structure, which includes a doped layer and a metal layer located in the doped layer; forming at least one opening exposing the metal layer in the semiconductor structure; removing the metal layer by a reaction between a wet etching solution and a metal to form a hollow portion, in which the wet etching solution enters the semiconductor structure through the opening; and filling the hollow portion with a non-metallic material layer through the opening to form the semiconductor test structure, in which an evaporation pressure of the metal layer is greater than an evaporation pressure of the non-metallic material layer.

Embodiments of the disclosure further provide a semiconductor test structure, applicable to atom probe tomography, including: a doped layer; a hollow portion, located in the doped layer; and a non-metallic material layer, located in the hollow portion.

It should be understood that, the above general description and the following detailed description are merely exemplary and explanatory, and cannot limit the disclosure. Techniques, methods, and devices known to those of ordinary skill in the relevant art may not be discussed in detail, but where appropriate, such techniques, methods, and devices should be considered as a part of the authorized specification.

BRIEF DESCRIPTION OF THE DRAWINGS

In order to describe the technical solutions in embodiments of the disclosure more clearly, the drawings required to be used in the embodiments of the disclosure will be simply introduced below. It is apparent that the drawings in the following descriptions are only some embodiments of the disclosure. Those of ordinary skill in the art may further obtain other drawings according to these drawings without any creative work.

DETAILED DESCRIPTION

Specific implementations of a semiconductor test structure and a manufacturing method therefor provided in the disclosure are described in detail with reference to the drawings. The following description of at least one exemplary embodiment is merely illustrative in nature and is not intended to limit the disclosure and application or use thereof in any way. That is to say, those skilled in the art will understand that, the descriptions are merely illustrative of the ways in which the descriptions can be used in real time, and are not exhaustive. In addition, unless specifically stated otherwise, the relative arrangement of the components and operations set forth in these embodiments does not limit the scope of the disclosure.

Figure 1:
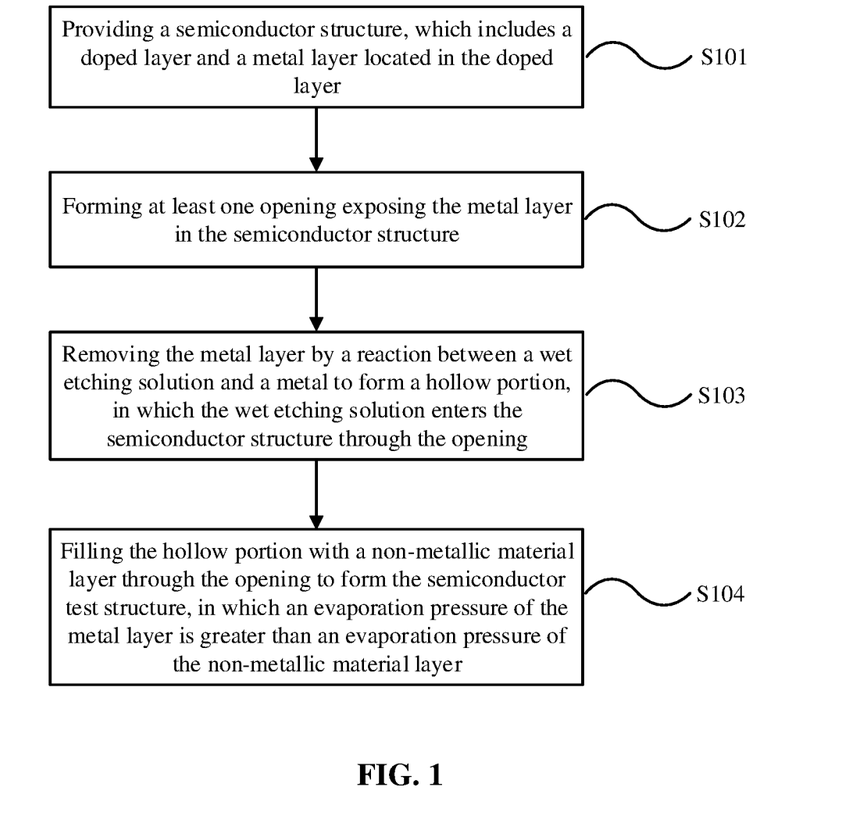
FIG. 1 is a flowchart of a method for manufacturing a semiconductor test structure according to an embodiment of the disclosure.

FIG. 1 is a flowchart of a method for manufacturing a semiconductor test structure according to an embodiment of the disclosure.

The method for manufacturing a semiconductor test structure includes the following operations. At S101, a semiconductor structure is provided, which includes a doped layer and a metal layer located in the doped layer. At S102, at least one opening is formed in the semiconductor structure, which exposes the metal layer. At S103, the metal layer is removed by a reaction between a wet etching solution and the metal to form a hollow portion, in which the wet etching solution enters the semiconductor structure through the opening. At S104, the hollow portion is filled with a non-metallic material layer through the opening to form the semiconductor test structure, in which an evaporation pressure of the metal layer is greater than an evaporation pressure of the non-metallic material layer.

Figure 2:
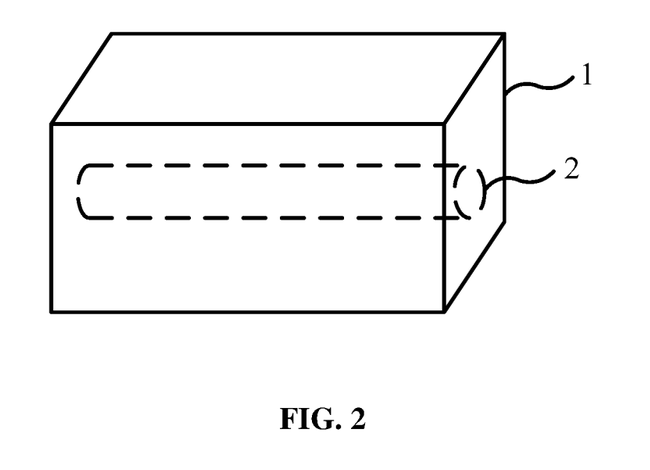
FIG. 2 is a schematic diagram of a semiconductor structure according to an embodiment of the disclosure.

Continuously referring to FIG. 1, at S101, the semiconductor structure is provided. The semiconductor structure includes a doped layer and a metal layer located in the doped layer. FIG. 2 is a schematic diagram of a semiconductor structure according to an embodiment of the disclosure. Referring to FIG. 2, the semiconductor structure is provided, in which the doped layer 1 and the metal layer 2 located in the doped layer 1 are presented. In this embodiment, the metal layer 2 is made of tungsten. In some other embodiments, the metal layer may also be a metal that can only be evaporated under an extremely high electric field, such as copper. In some other embodiments, the semiconductor has the doped layer and a metal compound layer located in the doped layer. For example, the material of the metal compound is silicon nitride.

Figure 9:
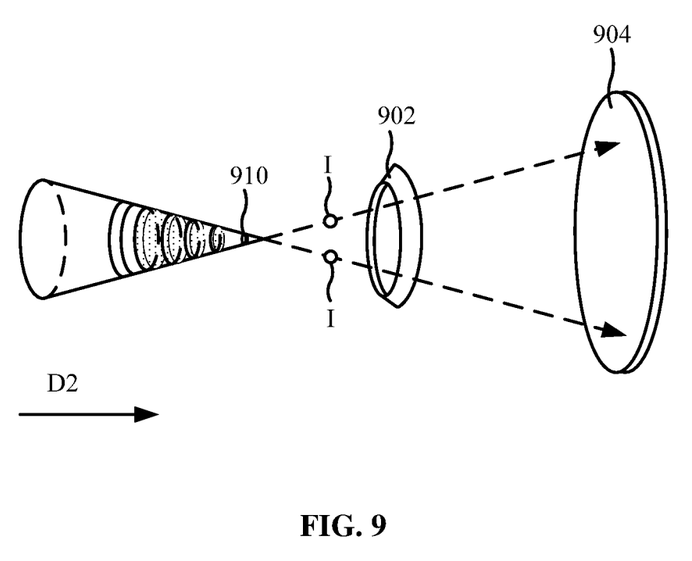
FIG. 9 is a schematic diagram of an atom probe tomography system according to an embodiment of the disclosure.

The metal or the metal compound can only be evaporated under the extremely high electric field. Atom probe tomography is based on the principle of "field evaporation", in which a strong voltage pulse or a laser pulse is applied to a sample, thus atoms of the sample are turned into ions one by one which are then collected. FIG. 9 is a schematic diagram of an atom probe tomography system according to an embodiment of the disclosure. The atom probe tomography system includes an electrode 902 and a detector 904. The electrode 902 is located between a sample to be detected 910 and the detector 904. The electrode 902 may be configured to apply a voltage pulse to the sample to be detected 910. In some embodiments, the electrode 902 may be an annular electrode. A long axis direction (that is, a second direction D2) of the sample to be detected 910 may pass through the hollow part of the annular electrode. A surface of the detector 904 may be substantially perpendicular to the long axis direction (that is, the second direction D2) of the sample to be detected 910. The detector 904 is configured to detect a position where an ion I hitting against the detector 904 comes from the sample to be detected 910, and detect traveling time of the ion I traveling from the sample to be detected 910 to the detector 904. Therefore, distribution positions and atom composition of atoms on the surface of the sample to be detected 910 may be calculated. For example, the detector 904 may include a position sensitive detector. In addition, the detector 904 may further include a time-of-flight mass spectrometer.

Figure 10:
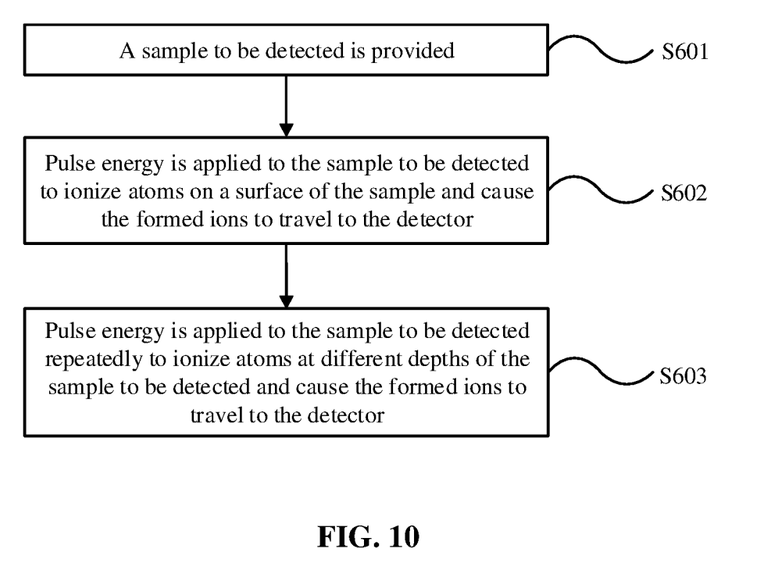
FIG. 10 is a flowchart of analysis of a sample to be detected by using atom probe tomography according to an embodiment of the disclosure.

FIG. 10 is a flowchart of analysis of a sample to be detected by using atom probe tomography according to an embodiment of the disclosure. The analysis of a sample to be detected by using atom probe tomography includes the following operations. At S601, a sample to be detected is provided. At S602, pulse energy is applied to the sample to be detected, to ionize atoms on a surface of the sample and cause the formed ions to travel to the detector. At S603, pulse energy to the sample to be detected is applied repeatedly, to ionize atoms at different depths of the sample to be detected and cause the formed ions to travel to the detector.

However, when a semiconductor structure has a metal layer or a metal compound layer located in a doped layer, although the doping ions in the doped layer around the metal layer or the metal compound layer can be detected by the atom probe tomography, the doping ions in the doped layer under the metal layer cannot be detected. If an electric field that can evaporate the metal layer or the metal compound layer is applied to the sample, such electric field may damage the doped layer. As a result, it is difficult to apply the atom probe tomography to the semiconductor structure having a metal or a metal compound. A metal such as tungsten, copper or the like that can only be evaporated under an extremely high electric field are required to be removed first, and then the semiconductor structure having the metal or the metal compound can be detected. A semiconductor of which a doped layer contains a metal layer is used as an example for illustration below.

Figure 3:
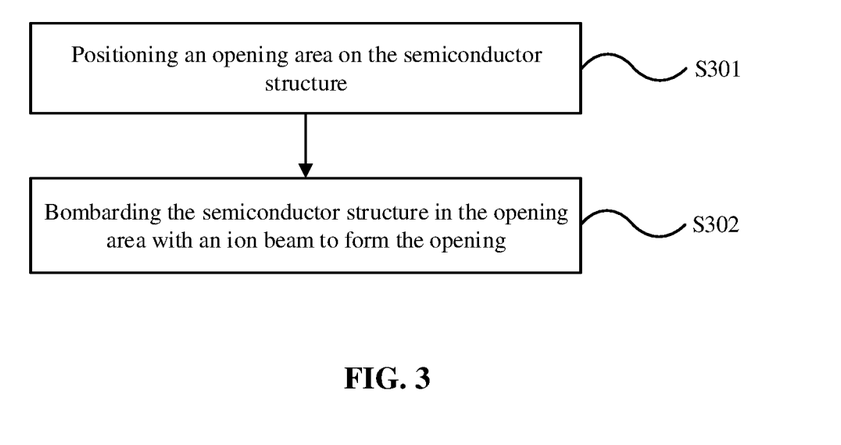
FIG. 3 is a flowchart of a method for manufacturing a semiconductor test structure according to an embodiment of the disclosure.

Further referring to FIG. 1, at S102, at least one opening is formed in the semiconductor structure, which exposes the metal layer. FIG. 3 is a flowchart of a method for manufacturing a semiconductor test structure according to an embodiment of the disclosure. Referring to FIG. 3, S102 of forming at least one opening in the semiconductor structure, which exposes the metal layer, includes the following operations. At S301, an opening area is positioned on the semiconductor structure. At S302, the semiconductor structure in the opening area is bombarded with an ion beam to form the opening.

Figure 4:
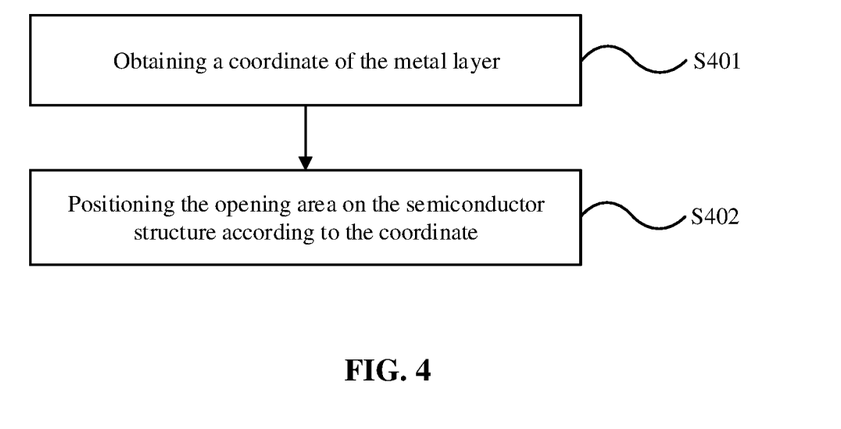
FIG. 4 is a flowchart of a method for manufacturing a semiconductor test structure according to an embodiment of the disclosure.

FIG. 4 is a flowchart of a method for manufacturing a semiconductor test structure according to an embodiment of the disclosure. Referring to FIG. 4, S301 of positioning the opening area 3 on the semiconductor structure 1 includes the following operations. At S401, a coordinate of the metal layer is obtained. At S402, the opening area is positioned on the semiconductor structure according to the coordinate. In some embodiments, the metal layer may be positioned by utilizing the difference in light absorptivity of different materials to obtain the coordinate of the metal layer. For example, in this embodiment, the absorptivity of an infrared ray by the metal layer is higher than that by the doped layer, so that the infrared ray may be used to detect the metal layer. In some embodiments, the coordinate of the metal layer may be obtained through a layout design of the semiconductor structure. Therefore, the opening area is formed according to the coordinate of the metal layer.

Figure 5:
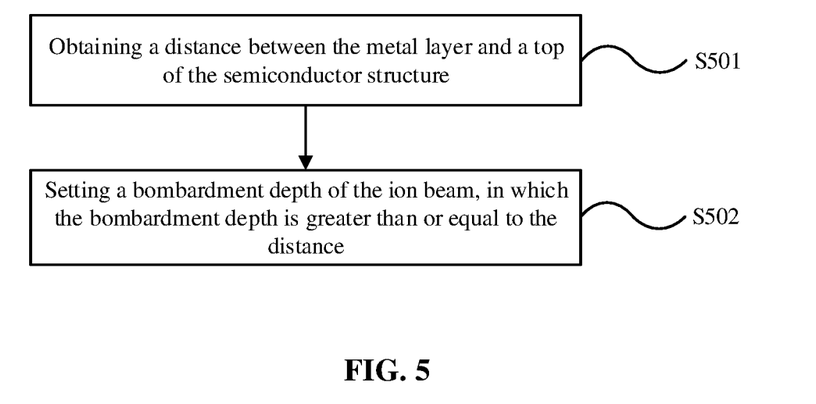
FIG. 5 is a flowchart of a method for manufacturing a semiconductor test structure according to an embodiment of the disclosure.

FIG. 5 is a flowchart of a method for manufacturing a semiconductor test structure according to an embodiment of the disclosure. Referring to FIG. 5, S302 of bombarding the semiconductor structure in the opening area with an ion beam includes the following operations. At S501, a distance between the metal layer and a top of the semiconductor structure is obtained. At S502, a bombardment depth of an ion beam is set, and the bombardment depth is greater than or equal to the distance, so that the metal layer can be exposed from the opening.

Figure 6:
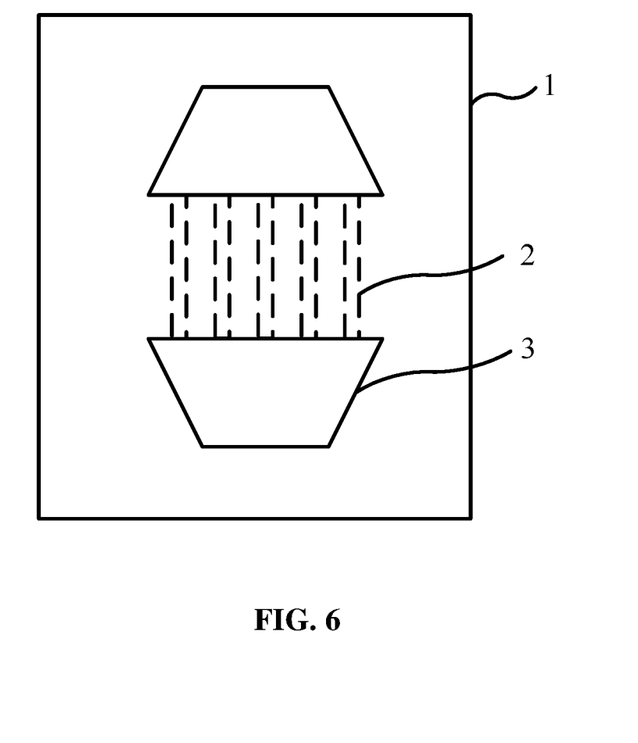
FIG. 6 is a schematic diagram of a semiconductor test structure according to an embodiment of the disclosure.

FIG. 6 is a schematic diagram of a semiconductor test structure according to an embodiment of the disclosure. In this embodiment, two opening areas 3 are positioned on the upper surface of the semiconductor structure. The opening areas 3 are located on two ends of the metal layers 2. In some other embodiments, the opening areas may be positioned in other positions of the semiconductor structure, such as a sidewall of the semiconductor structure. Therefore, the opening areas are located on the two ends of the metal layer 2 or other positions where the metal layer can be exposed. It is to be understood that, the opening areas or areas bombarded by an ion beam should not affect characterization of the semiconductor test structure. In some other embodiments, the material(s) of the opening areas may be removed in a manner such as grinding, anisotropic etching or the like, until the metal layer is exposed.

Further referring to FIG. 1, at S103, the metal layer is removed through a reaction between the wet etching solution and the metal layer 2 to form the hollow portion, in which the wet etching solution enters the semiconductor structure through the opening. In this embodiment, the metal layer is made of tungsten. The metal tungsten is removed by the reaction between the wet etching solution and the metal tungsten. The wet etching solution is a mixed solution of hydrogen peroxide and ammonium hydroxide with the mass ratio of (0.9-1):(1-1.5). The metal tungsten is removed through the reaction between the ammonium hydroxide in the wet etching solution and tungsten. The reaction speed is accelerated by increasing the mass ratio of ammonium hydroxide in the mixed solution. Hydrogen peroxide in the mixed solution is used as a negative catalyst. By increasing the mass ratio of hydrogen peroxide, the reaction speed of the metal tungsten and ammonium hydroxide can be slowed down, so that an etching process can be accurately controlled. In this embodiment, when the mass ratio of hydrogen peroxide to ammonium hydroxide is less than 0.9:1.5, the mixed solution may affect the doped layer. When the mass ratio of hydrogen peroxide to ammonium hydroxide is greater than 1:1, the etching rate of the mixed solution is reduced, and the processing time is prolonged. For example, at room temperature, the mixed solution of hydrogen peroxide and ammonium hydroxide with the mass ratio of 1:1 is introduced into the semiconductor structure through the opening to react with tungsten to remove tungsten and form a hollow portion at the position where the metal tungsten is originally located.

In some other embodiments, when the material of the metal layer is copper, the mixed solution of hydrogen peroxide and sulfuric acid with a mass ratio of (0.5-1):(1-1.5) may be used as the wet etching solution. The metal copper is removed through the reaction between sulfuric acid in the wet etching solution and copper. The reaction speed is accelerated by increasing the mass ratio of the sulfuric acid in the mixed solution. Hydrogen peroxide in the mixed solution is used as a negative catalyst. By increasing the mass ratio of hydrogen peroxide, the reaction speed of the metal copper and sulfuric acid can be slowed down, so that the etching process can be accurately controlled. In this embodiment, when the mass ratio of hydrogen peroxide to sulfuric acid is less than 0.5:1.5, the mixed solution may affect the doped layer. When the mass ratio of hydrogen peroxide to sulfuric acid is greater than 1:1, the etching rate of the mixed solution is reduced, and the processing time is prolonged. For example, the mixed solution of hydrogen peroxide and sulfuric acid with the mass ratio of 0.8:1 is introduced into the semiconductor structure through the opening to react with copper, so as to remove copper and form the hollow portion at the position where the metal copper is originally located. In some other embodiments, when the metal layer is made of aluminum, hydrochloric acid is used as the wet etching solution, and is introduced into the semiconductor structure through the opening to react with aluminum, so as to remove aluminum and form the hollow portion at the position where the metal aluminum is originally located.

By forming the hollow portion at the position where the metal layer or the metal compound layer is originally located, the doping ions in the doped layer under the metal layer can be detected. However, due to the existence of the hollowing portion, the doping ions located at different levels may be simultaneously detected, leading to failure of the doping ion analysis. Therefore, the hollow portion needs to be filled.

In some other embodiments, the semiconductor structure has a metal compound layer located in the doped layer. For example, when the metal compound layer is made of titanium nitride, the mixed solution of hydrogen peroxide and ammonium hydroxide with the mass ratio of (0.5-1):(1-1.5) may also be used as the wet etching solution to react with titanium nitride, so as to remove titanium nitride.

Continuously referring to FIG. 1, at S104, the hollow portion is filled with a non-metallic material layer through the opening to form the semiconductor test structure, in which an evaporation pressure of the metal layer is greater than an evaporation pressure of the non-metallic material layer. By replacing the metal layer with a large evaporation with the non-metallic material layer with a small evaporation pressure, the influence in the application of atom probe tomography on the semiconductor test structure due to the property of a metal evaporated under an extremely high electric field can be avoided. For example, the metal tungsten in the semiconductor structure in this embodiment is replaced with liquid glass cement. By filling with the non-metallic material layer in the hollow portion in a manner of spin-coating the liquid glass cement on the surface of the sample to be detected, bubbles can be prevented from being generated during filling, and the liquid glass cement can be uniformly filled in the hollow portion. The hollow portion formed after the metal layer is removed is filled up by utilizing the fluidity of the liquid, and then the semiconductor structure is allowed to stand until the glass cement is cured, so as to form the semiconductor test structure that can be characterized by the atom probe tomography. In some other embodiments, the non-metallic material layer may be formed in the opening by performing atomic layer deposition for several times, in which the non-metallic layer may include silicon oxide, silicon nitride or silicon oxynitride. Since atomic layer deposition has a desirable caulking effect, the non-metallic material layer can be completely filled in the hollow portion by performing atomic layer deposition for several times. In this way, an air gap is prevented from forming in the hollow portion, and test accuracy is enhanced.

In the above technical solution, at S102, the semiconductor structure 1 having a metal layer is partially opened, so that the integrity of other parts of the semiconductor structure is guaranteed without exposing the metal layer other than the opening area. At S103, by removing the metal layer 2 inside the semiconductor structure through the opening area 3, it can be avoided that doping ions under the metal layer cannot be detected due to the metal layer with large evaporation pressure presented in the semiconductor structure. At S104, the hollow portion is filled with a non-metallic material layer through the opening, and the metal layer with a large evaporation is replaced with the non-metallic material layer with a small evaporation pressure, so as to form the semiconductor test structure. In this way, the doping ions located at different levels are prevented from being simultaneously detected when detecting the doping ions in the doped layer under the metal layer. Therefore, the influence, due to the property of the metal evaporated under an extremely high electric field, in the application of atom probe tomography on the semiconductor test structure can be avoided.

Figure 7:
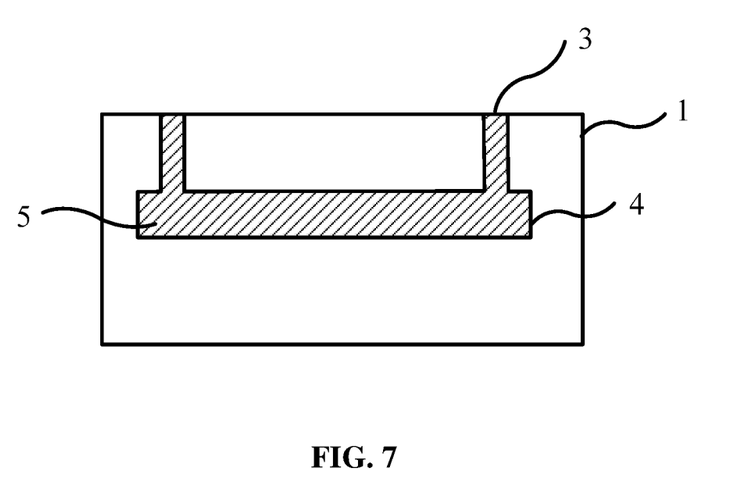
FIG. 7 is a cross-sectional view of a semiconductor test structure according to an embodiment of the disclosure.

FIG. 7 is a cross-sectional view of a semiconductor test structure according to an embodiment of the disclosure. Referring to FIG. 7, the semiconductor test structure, applicable to atom probe tomography, includes: a doped layer 1; a hollow portion 4, located in the doped layer 1; and a non-metallic material layer 5, located in the hollow portion 4. The semiconductor structure further includes an opening 3, which is located on a surface of the semiconductor test structure and communicated with the hollow portion 4. The non-metallic material layer 5 is located in the hollow portion 4 and within the opening 3. The semiconductor test structure can be characterized by atom probe tomography.

Figure 8:
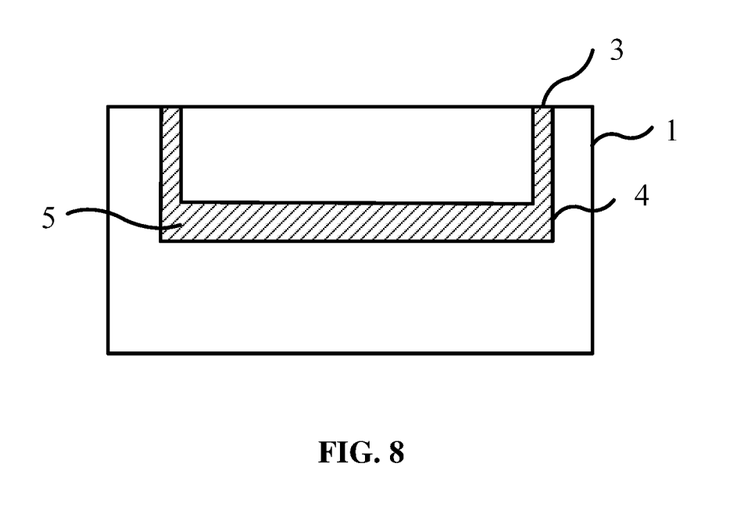
FIG. 8 is a cross-sectional view of a semiconductor test structure according to another embodiment of the disclosure.

FIG. 8 is a cross-sectional view of a semiconductor test structure according to another embodiment of the disclosure. In this embodiment, the openings 3 are connected to two ends of the hollow portion 4.

Illustration will be provided below with an example in which a semiconductor structure having a metal layer is manufactured into a semiconductor test structure that can be characterized by atom probe tomography. In some other embodiments, the semiconductor structure may be applicable to other situations where a material that is not conducive to the characterization of the semiconductor test structure is replaced with a material that is conductive to the characterization of the semiconductor test structure.

FIG. 1 is a flowchart of a method for manufacturing a semiconductor test structure according to an embodiment of the disclosure.

The method for manufacturing a semiconductor test structure includes the following operations. At S101, a semiconductor structure is provided, which includes a doped layer and a metal layer located in the doped layer. At S102, at least one opening is formed in the semiconductor structure, which exposes the metal layer. At S103, the metal layer is removed by a reaction between a wet etching solution and the metal to form a hollow portion, in which the wet etching solution enters the semiconductor structure through the opening. At S104, the hollow portion is filled with a non-metallic material layer through the opening to form the semiconductor test structure, in which an evaporation pressure of the metal layer is greater than an evaporation pressure of the non-metallic material layer.

Continuously referring to FIG. 1, at S101, the semiconductor structure is provided. The semiconductor structure includes a doped layer and a metal layer located in the doped layer. FIG. 2 is a schematic diagram of a semiconductor structure according to an embodiment of the disclosure. Referring to FIG. 2, the semiconductor structure is provided, in which the doped layer 1 and the metal layer 2 located in the doped layer 1 are presented. In this embodiment, the metal layer 2 is made of tungsten. In some other embodiments, the metal layer may also be a metal that can only be evaporated under an extremely high electric field, such as copper. In some other embodiments, the semiconductor has the doped layer and a metal compound layer located in the doped layer. For example, the material of the metal compound is silicon nitride.

The metal or the metal compound can only be evaporated under the extremely high electric field. Atom probe tomography is based on the principle of "field evaporation", in which a strong voltage pulse or a laser pulse is applied to a sample, thus atoms of the sample are turned into ions one by one which are then collected. Therefore, when a semiconductor structure has a metal layer or a metal compound layer located in a doped layer, although the doping ions in the doped layer around the metal layer or the metal compound layer can be detected by the atom probe tomography, the doping ions in the doped layer under the metal layer cannot be detected. If an electric field that can evaporate the metal layer or the metal compound layer is applied to the sample, such electric field may cause the sample to be blown up. As a result, it is difficult to apply the atom probe tomography to the semiconductor structure having a metal or a metal compound. A metal such as tungsten, copper or the like that can only be evaporated under an extremely high electric field are required to be removed first, and then the semiconductor structure having the metal or the metal compound can be detected. A semiconductor of which a doped layer contains a metal layer is used as an example for illustration below.

Further referring to FIG. 1, at S102, at least one opening is formed in the semiconductor structure, which exposes the metal layer. FIG. 3 is a flowchart of a method for manufacturing a semiconductor test structure according to an embodiment of the disclosure. Referring to FIG. 3, S102 of forming at least one opening in the semiconductor structure, which exposes the metal layer, includes the following operations. At S301, an opening area is positioned on the semiconductor structure. At S302, the semiconductor structure in the opening area is bombarded with an ion beam to form the opening.

FIG. 4 is a flowchart of a method for manufacturing a semiconductor test structure according to an embodiment of the disclosure. Referring to FIG. 4, S301 of positioning the opening area 3 on the semiconductor structure 1 includes the following operations. At S401, a coordinate of the metal layer is obtained. At S402, the opening area is positioned on the semiconductor structure according to the coordinate. In some embodiments, the metal layer may be positioned by utilizing the difference in light absorptivity of different materials to obtain the coordinate of the metal layer. For example, in this embodiment, the absorptivity of an infrared ray by the metal layer is higher than that by the doped layer, so that the infrared ray may be used to detect the metal layer. In some embodiments, the coordinate of the metal layer may be obtained through a layout design of the semiconductor structure. Therefore, the opening area is formed according to the coordinate of the metal layer.

FIG. 5 is a flowchart of a method for manufacturing a semiconductor test structure according to an embodiment of the disclosure. Referring to FIG. 5, S302 of bombarding the semiconductor structure in the opening area with an ion beam includes the following operations. At S501, a distance between the metal layer and a top of the semiconductor structure is obtained. At S502, a bombardment depth of an ion beam is set, and the bombardment depth is greater than or equal to the distance, so that the metal layer can be exposed from the opening.

FIG. 6 is a schematic diagram of a semiconductor test structure according to an embodiment of the disclosure. In this embodiment, two opening areas 3 are positioned on the upper surface of the semiconductor structure. The opening areas 3 are located on two ends of the metal layers 2. In some other embodiments, the opening areas may be positioned in other positions of the semiconductor structure, such as a sidewall of the semiconductor structure. Therefore, the opening areas are located on the two ends of the metal layer 2 or other positions where the metal layer can be exposed. It is to be understood that, the opening areas or areas bombarded by an ion beam should not affect characterization of the semiconductor test structure. In some other embodiments, the material(s) of the opening areas may be removed in a manner such as grinding, anisotropic etching or the like, until the metal layer is exposed.

Further referring to FIG. 1, at S103, the metal layer is removed through a reaction between the wet etching solution and the metal layer 2 to form the hollow portion, in which the wet etching solution enters the semiconductor structure through the opening. In this embodiment, the metal layer is made of tungsten. The metal tungsten is removed by the reaction between the wet etching solution and the metal tungsten. The wet etching solution is a mixed solution of hydrogen peroxide and ammonium hydroxide with the mass ratio of (0.9-1):(1-1.5). The metal tungsten is removed through the reaction between the ammonium hydroxide in the wet etching solution and tungsten. The reaction speed is accelerated by increasing the mass ratio of ammonium hydroxide in the mixed solution. Hydrogen peroxide in the mixed solution is used as a negative catalyst. By increasing the mass ratio of hydrogen peroxide, the reaction speed of the metal tungsten and ammonium hydroxide can be slowed down, so that an etching process can be accurately controlled. In this embodiment, when the mass ratio of hydrogen peroxide to ammonium hydroxide is less than 0.9:1.5, the mixed solution may affect the doped layer. When the mass ratio of hydrogen peroxide to ammonium hydroxide is greater than 1:1, the etching rate of the mixed solution is reduced, and the processing time is prolonged. For example, at room temperature, the mixed solution of hydrogen peroxide and ammonium hydroxide with the mass ratio of 1:1 is introduced into the semiconductor structure through the opening to react with tungsten to remove tungsten and form a hollow portion at the position where the metal tungsten is originally located.

In some other embodiments, when the material of the metal layer is copper, the mixed solution of hydrogen peroxide and sulfuric acid with a mass ratio of (0.5-1):(1-1.5) may be used as the wet etching solution. The metal copper is removed through the reaction between sulfuric acid in the wet etching solution and copper. The reaction speed is accelerated by increasing the mass ratio of the sulfuric acid in the mixed solution. Hydrogen peroxide in the mixed solution is used as a negative catalyst. By increasing the mass ratio of hydrogen peroxide, the reaction speed of the metal copper and sulfuric acid can be slowed down, so that the etching process can be accurately controlled. In this embodiment, when the mass ratio of hydrogen peroxide to sulfuric acid is less than 0.5:1.5, the mixed solution may affect the doped layer. When the mass ratio of hydrogen peroxide to sulfuric acid is greater than 1:1, the etching rate of the mixed solution is reduced, and the processing time is prolonged.

For example, the mixed solution of hydrogen peroxide and sulfuric acid with the mass ratio of 0.8:1 is introduced into the semiconductor structure through the opening to react with copper, so as to remove copper and form the hollow portion at the position where the metal copper is originally located. By forming the hollow portion at the position where the metal layer or the metal compound layer is originally located, the doping ions in the doped layer under the metal layer can be detected. However, due to the existence of the hollowing portion, the doping ions located at different levels may be simultaneously detected, leading to failure of the doping ion analysis. Therefore, the hollow portion needs to be filled.

In some other embodiments, the semiconductor structure has a metal compound layer located in the doped layer. For example, when the metal compound layer is made of titanium nitride, the mixed solution of hydrogen peroxide and ammonium hydroxide with the mass ratio of (0.5-1):(1-1.5) may also be used as the wet etching solution to react with titanium nitride, so as to remove titanium nitride.

Continuously referring to FIG. 1, at S104, the hollow portion is filled with a non-metallic material layer through the opening to form the semiconductor test structure, in which an evaporation pressure of the metal layer is greater than an evaporation pressure of the non-metallic material layer. By replacing the metal layer with a large evaporation with the non-metallic material layer with a small evaporation pressure, the influence in the application of atom probe tomography on the semiconductor test structure due to the property of a metal evaporated under an extremely high electric field can be avoided. For example, the metal tungsten in the semiconductor structure in this embodiment is replaced with liquid glass cement. By filling with the non-metallic material layer in the hollow portion in a manner of spin-coating the liquid glass cement on the surface of the sample to be detected, bubbles can be prevented from being generated during filling, and the liquid glass cement can be uniformly filled in the hollow portion. The hollow portion formed after the metal layer is removed is filled up by utilizing the fluidity of the liquid, and then the semiconductor structure is allowed to stand until the glass cement is cured, so as to form the semiconductor test structure that can be characterized by the atom probe tomography. In some other embodiments, the non-metallic material layer may be formed in the opening by performing atomic layer deposition for several times, in which the non-metallic layer may include silicon oxide, silicon nitride or silicon oxynitride. Since atomic layer deposition has a desirable caulking effect, the non-metallic material layer can be completely filled in the hollow portion by performing atomic layer deposition for several times.

Further referring to FIG. 1, at S104, the hollow portion is filled with a non-metallic material layer through the opening to form the semiconductor test structure, in which an evaporation pressure of the metal layer is greater than an evaporation pressure of the non-metallic material layer. By replacing the metal layer with a large evaporation with the non-metallic material layer with a small evaporation pressure, the influence due to the property of a metal evaporated under an extremely high electric field in the application of atom probe tomography on the semiconductor test structure can be avoided. For example, the metal tungsten in the semiconductor structure in this embodiment is replaced with liquid glass cement. The hollow portion formed after the metal layer is removed is filled up by utilizing the fluidity of the liquid, and then the semiconductor structure is allowed to stand until the glass cement is cured, so as to form the semiconductor test structure that can be characterized by the atom probe tomography. In some other embodiments, the metal tungsten may be replaced with a liquid silicon dioxide layer or other non-metallic material having fluidity. In this embodiment, the non-metallic material layer is filled into the position of the metal layer in a manner of spin-coating the liquid glass cement on the surface of the sample to be detected, thus the bubbles are prevented from being generated, and the liquid glass cement can be uniformly filled in the hollow portion.

According to the above technical solution, the semiconductor structure having a metal layer is partially opened, the metal layer 2 in the doped layer 1 of the semiconductor structure is removed through the opening 3 to form the hollow portion 4, so that the integrity of other parts of the semiconductor structure is guaranteed without exposing the metal layer other than the opening area. The hollow portion is filled with the non-metallic material layer 5 through the opening, and the metal layer with a large evaporation is replaced with the non-metallic material layer with a small evaporation pressure, so that the semiconductor test structure is formed. Therefore, the influence in the application of atom probe tomography on the semiconductor test structure due to the property of the metal evaporated under an extremely high electric field can be avoided.

It is also to be noted that relational terms such as first, second and so on are used merely to distinguish one entity or operation from another entity or operation herein, and do not necessarily require or imply the existence of any such actual relationship or order between these entities or operations. Furthermore, terms "comprise", "include" or any other variants are intended to encompass non-exclusive inclusion, such that a process, a method, an article or a device including a series of elements not only include those elements, but also includes other elements not listed explicitly or includes intrinsic elements for the process, the method, the article, or the device. Without any further limitation, an element defined by the phrase "further including one" does not exclude existence of other same elements in the process, the method, the article, or the device that includes the elements.

The above descriptions are merely preferred implementations of the disclosure, and are not intended to limit the protection scope of the disclosure. It is to be noted that persons of ordinary skill in the art may also make several improvements and refinements without departing from the principle of the present disclosure, and it should be considered that these improvements and refinements shall all fall within the protection scope of the present disclosure.

The invention claimed is:

1. A method for manufacturing a semiconductor test structure, comprising:
    providing a semiconductor structure, the semiconductor structure comprising a doped layer and a metal layer located in the doped layer;
    forming at least one opening in the semiconductor structure, the opening exposing the metal layer;
    removing the metal layer by a reaction between a wet etching solution and a metal to form a hollow portion, the wet etching solution entering the semiconductor structure through the opening; and
    filling the hollow portion with a non-metallic material layer through the opening to form the semiconductor test structure,
    wherein an evaporation pressure of the metal layer being greater than an evaporation pressure of the non-metallic material layer.

2. The method for manufacturing a semiconductor test structure of claim 1, wherein forming at least one opening in the semiconductor structure, the opening exposing the metal layer comprises:
    positioning an opening area on the semiconductor structure; and
    bombarding the semiconductor structure in the opening area with an ion beam to form the opening.

3. The method for manufacturing a semiconductor test structure of claim 2, wherein positioning the opening area on the semiconductor structure comprises:
    obtaining a coordinate of the metal layer; and
    positioning the opening area on the semiconductor structure according to the coordinate.

4. The method for manufacturing a semiconductor test structure of claim 2, wherein bombarding the semiconductor structure in the opening area with an ion beam comprises:
    obtaining a distance between the metal layer and a top of the semiconductor structure; and
    setting a bombardment depth of the ion beam, the bombardment depth being greater than or equal to the distance.

5. The method for manufacturing a semiconductor test structure of claim 1, wherein the metal layer comprises tungsten or titanium nitride.

6. The method for manufacturing a semiconductor test structure of claim 5, wherein the wet etching solution is a mixed solution of hydrogen peroxide and ammonium hydroxide with a mass ratio of (0.9-1):(1-1.5).

7. The method for manufacturing a semiconductor test structure of claim 1, wherein a material of the metal layer comprises copper.

8. The method for manufacturing a semiconductor test structure of claim 7, wherein the wet etching solution is a mixed solution of hydrogen peroxide and sulfuric acid with a mass ratio of (0.5-1):(1-1.5).

9. The method for manufacturing a semiconductor test structure of claim 1, wherein a material of the metal layer comprises aluminum.

10. The method for manufacturing a semiconductor test structure of claim 9, wherein the wet etching solution is hydrochloric acid.

11. The method for manufacturing a semiconductor test structure of claim 1, wherein the non-metallic material layer has fluidity.

12. The method for manufacturing a semiconductor test structure of claim 11, wherein the non-metallic material layer comprises liquid glass cement.

13. The method for manufacturing a semiconductor test structure of claim 1, wherein the non-metallic material layer is formed in the opening by performing atomic layer deposition for multiple times.

14. The method for manufacturing a semiconductor test structure of claim 13, wherein the non-metallic material layer comprises silicon oxide, silicon nitride or silicon oxynitride.

* * * * *